United States Patent [19]
Yamamoto et al.

[11] Patent Number: 5,089,838
[45] Date of Patent: Feb. 18, 1992

[54] PRESSURE DEVELOPING DEVICE

[75] Inventors: Takemi Yamamoto, Nagoya; Hiroshi Kawahara, Nishikasugai; Yumio Matsumoto, Kasugai; Shigeyuki Hayashi, Nagoya; Kiyoharu Hayakawa, Ama; Osamu Takagi, Nagoya; Yuji Asano, Nagoya; Takao Nakazawa, Nagoya; Shunichi Higashiyama, Nagoya, all of Japan

[73] Assignee: Brother Kogyo Kabushiki Kaisha, Aichi, Japan

[21] Appl. No.: 515,090

[22] Filed: Apr. 26, 1990

Related U.S. Application Data

[63] Continuation-in-part of Ser. No. 339,803, Apr. 18, 1989, Pat. No. 4,945,374.

[30] Foreign Application Priority Data

| Apr. 20, 1988 | [JP] | Japan | 63-97813 |
| Aug. 9, 1988 | [JP] | Japan | 63-199276 |
| Aug. 19, 1988 | [JP] | Japan | 63-206876 |

[51] Int. Cl.⁵ .................... G03B 27/52; B30B 3/04; G03D 5/02
[52] U.S. Cl. .................... 354/304; 355/27; 100/160; 100/168; 100/176
[58] Field of Search .............. 354/297, 304; 355/27, 355/28; 430/138; 100/160, 168, 176

[56] References Cited

U.S. PATENT DOCUMENTS

| 4,714,943 | 12/1987 | Sakakibara et al. |
| 4,827,312 | 5/1989 | Ogiwara et al. ............ 355/27 |
| 4,878,084 | 10/1989 | Hayakawa et al. .......... 355/27 |

FOREIGN PATENT DOCUMENTS

| 0240938 | 4/1987 | European Pat. Off. |
| 0318837 | 11/1988 | European Pat. Off. |
| 0333481 | 3/1989 | European Pat. Off. |
| 0338828 | 4/1989 | European Pat. Off. |
| 58-23025 | 2/1983 | Japan |
| 58-88739 | 5/1983 | Japan |

OTHER PUBLICATIONS

European Search Report on Application No. EP 90 20 1358, dated 10-1-90.

Primary Examiner—A. A. Mathews
Attorney, Agent, or Firm—Kane, Dalsimer, Sullivan, Kurucz, Levy, Eisele and Richard

[57] ABSTRACT

In a pressure developing device employed in an imaging device like a duplicating machine, an optical printer etc., pressure force for evenly pressurizing a recording medium is capable of being varied in accordance with the width of the recording medium to be pressurized.

11 Claims, 9 Drawing Sheets

FIG. 5
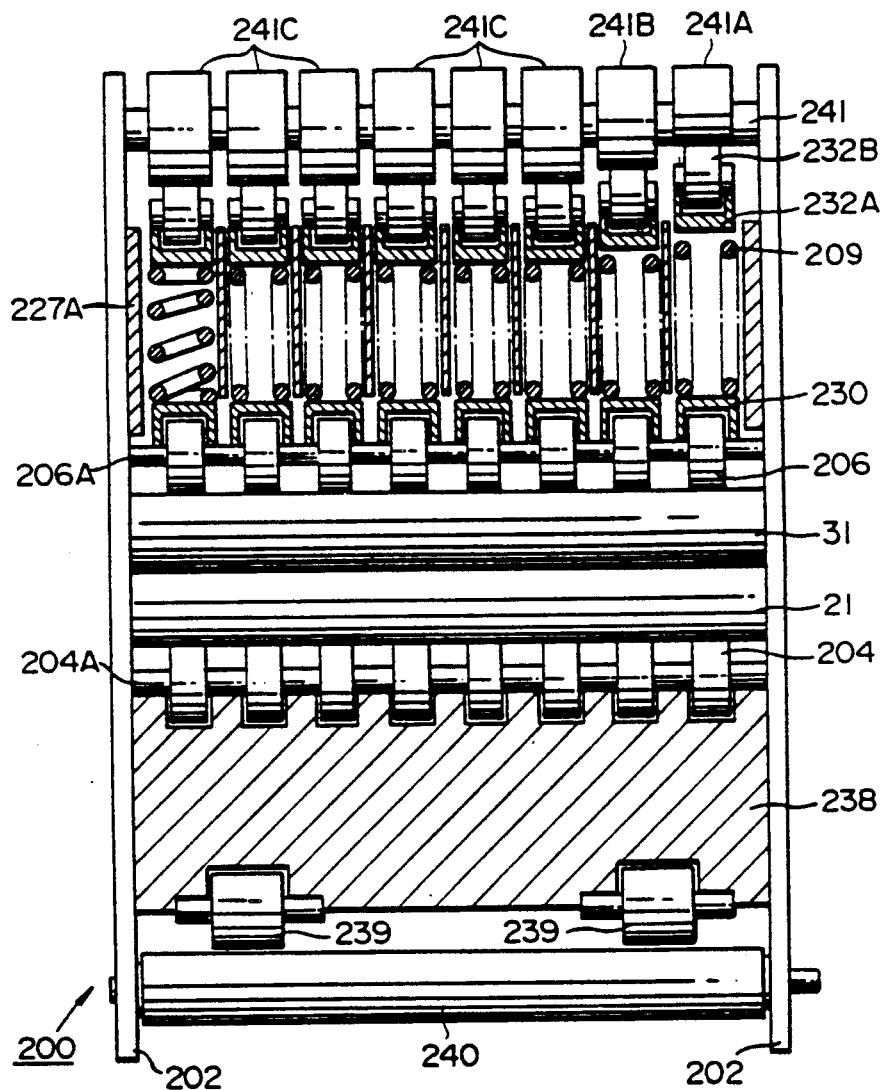
FIG.6(A) FIG.6(B) FIG.6(C)
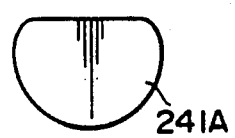
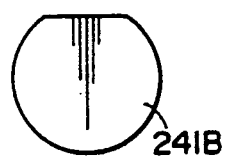
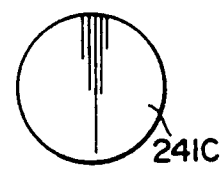

PRESSURE DEVELOPING DEVICE

CROSS-REFERENCE TO OTHER APPLICATIONS

The present application is a continuation-in-part of application Ser. No. 339,803 filed Apr. 18, 1989, now U.S. Pat. No. 4,945,374.

BACKGROUND OF THE INVENTION

This invention relates to a pressure developing device for developing with a pressure force applied to a recording medium, more particularly, to a pressure developing device having a function for detecting width of the recording medium to be pressurized and being capable of varying pressure force in accordance with the detected width of the recording medium.

Sensitized paper of microcapsule type for use with color duplicators and color image recording devices is disclosed as already known in Japanese Patent Provisional publication SH058-23025 and SH058-88739. There are two different types of such sensitized paper, self-developing type and transfer type.

Self-developing type sensitized paper consists of a layer of developer material coated on plain paper, which layer is further coated with a layer of microcapsules containing dye precursor, photo-hardening resin, sensitizer and polymerization initiator. When light from a light source shines such sensitized paper thorough a text for instance in the form of photo-film, the microcapsules are photo-harden only on the area corresponding to the text area through which the light are passed. The sensitized paper is then passed between the pressure rollers of the pressure developing device to apply pressure force to the paper for developing a visible image. This causes the microcapsules remaining unharden to be crushed on the area corresponding to another text area that has allowed no light beams to pass. The precursor etc. contained in the crushed microcapsules then undergoes color-developing reaction with the developer material on the developer layer to thereby effect color development.

In case of the transfer type sensitized paper, on the other hand, the sensitized paper carries on its surface a microcapsule layer alone with no coating of developer material, separately requiring sheets of developing paper with a developer layer only. When using such transfer type paper, after certain exposure treatment of the sensitized paper, the developing paper is laid upon the exposed surface of the sensitized paper. The two sheets of paper are then pressurized together by the pressure developing device to cause a color developing reaction on the developing paper, so that a color image appears on the developing paper.

With such sensitized paper pressure-developed by the pressure developing device as described above, a high-quality picture that has not been available on conventional toner images is obtained in either self-developing type or transfer type.

For such a pressure developing device, an arrangement with a pair of pressure rollers is widely used because of its advantages in space and cost. In conventional pressure developing devices, sizes of sensitized paper (in particular, widths) in major use are preset so that a certain pressure is applied to the paper over the preset size of the paper extending longitudinally of the pressure roller pair.

When developing the self-developing sensitized paper by means of a pressure developing device, however, a pressure force applied between the pressure rollers must be in the order of 90 kg/cm to crush the unharden microcapsules on the sensitized paper, in consideration of the weight resistance of the sensitized paper and other factors. Taking for example a conventional pressure developing device in which a pair of pressure rollers are so pressurized that this amount force should be applied to the sensitized paper of preset size (A4: 210 mm×300 mm), if a sheet of paper smaller than the preset paper size (A4) is placed between the pressure rollers, the pressure force applied to the sensitized paper is higher than the pressure force applied to the paper (about 90 kg/cm) mentioned above. If oppositely the paper larger than the preset size (A4) is placed between the pressure rollers, the pressure force applied to the sensitized paper is lower than the pressure force applied to the paper (about 90 kg/cm). For this reason, in conventional pressure developing devices, when any piece of paper whose size is different from the preset size is placed between the pressure rollers, color strength is most likely different among paper sizes because the pressure force for each paper size is different, resulting in an uneven picture quality.

Further in conventional pressure developing devices, the pressure force to the both ends of the paper width has been substantially the same as that applied to the middle part of paper. This has caused such problems that, since sheets of sensitized paper is very thin in general, paper is apt to wrinkle when it is inserted between the pressure rollers.

SUMMARY OF THE INVENTION

It is therefore an object of the invention to provide an improved pressure developing device capable of varying pressure force to be applied to a recording medium in accordance with a width of the recording medium to be pressurized.

A further object is to provide an improved pressure developing device capable of evenly pressurizing a recording medium along a width direction.

For this purpose, according to this invention, there is provided a pressure developing device having a pair of pressure rollers being adapted to be brought into and out of contact with each other for pressurizing an exposed recording sheet containing a plurality of photosensitive microcapsules each containing a component to change the rupture strength thereof when exposed to light and a developing sheet coated with a developer material to develop a visible image, said pressure developing device further comprising:

detect means for detecting width of the developing sheet to be pressurized by said pair of rollers; and control means for controlling said pair of rollers so as to pressurize an area corresponding to the width detected by said detect means of the recording sheet and the developing sheet with a predetermined pressure force less than said predetermined pressure force.

DESCRIPTION OF THE ACCOMPANYING DRAWINGS

FIG. 1 is a schematic structural view of an imaging device incorporating a pressure developing device according to the invention, FIG. 2 is a sectional view showing one embodiment of the invention, FIG. 3 is an explanatory view showing positional relationship of a shaft, back up rollers and cams on a camshaft of the pressure developing device shown in FIG. 2, FIG. 4 and FIG. 5 are sectional views showing another embodiments of the invention, FIG. 6(A) through B(C) are structural views of the cams employed in the pressure developing device shown in FIG. 5, FIG. 7 is a sectional view showing another embodiment of the invention, FIG. 8 is an explanatory view showing an image produced by a pressure developing unit according to the invention.

DESCRIPTION OF THE EMBODIMENTS

Figure 1:
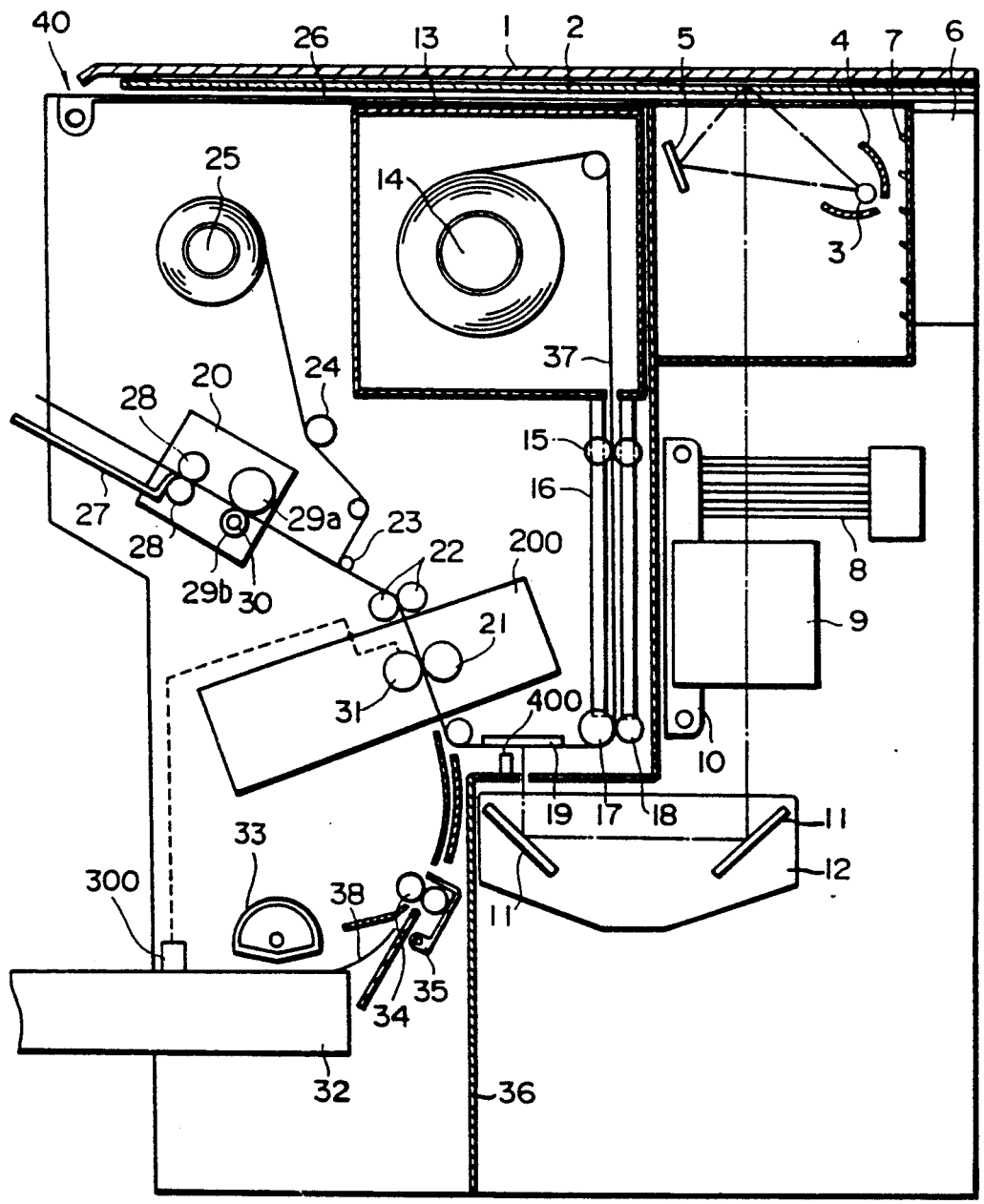

FIG. 1 is a schematic sectional view of a full color copying machine 40 incorporating a pressure developing device embodying the invention.

The copying machine 40 includes, as shown a glass tray 2 and a tray cover 1, between which an original image subject, not shown, is placed up side down. Both the cover 1 and the tray 2 are reciprocally movable rightward and leftward in FIG. 1 as one unit. Secured to the upper right portion, in FIG. 1 of the machine 40 is a halogen lamp 3 extending perpendicularly to the direction of the reciprocal movement of the glass tray 2, and a semi-cylindrical reflection mirror 4 located to surround the lamp 3, so that it shines the original subject through the glass tray 2.

As the glass tray 2 is reciprocated, the light beams emitted from the halogen lamp 3 are allowed to shine the whole surface of the glass tray 2 from its left end to right. The light beams emitted from the lamp 3 pass through the glass tray 2 and are reflected on the original subject placed thereon. Further, in order to use the light emitted from the lamp 3 for shining the original subject with a greater efficiency, a reflector 5 is provided so that the light beams that were not directed to the original subject are reflected there toward the original subject.

A fan 6 and a louver wall 7 are provided to the right of the lamp 3 to intake air from outside. This allows the glass tray 2 to be well cooled.

The light beams emitted from the halogen lamp 3 and reflected from the original subject placed on the glass tray 2 are led to a lens system 9 through a filter 8. The filter 8 is provided with at least three filter sections, each section selectively passing the light which has a wavelength corresponding to the sensitivity of one of at least three groups of microcapsules of a recording sheet 37 so as to adjust tonality of the duplicated image. As the recording sheet 37, in this embodiment, the continuous form coated with a plurality of microcapsules each containing therein a chromagenic material and a photo-curable resin, as has been proposed in Japanese Patent Provisional Publication No. SH058-88739, is employed. That is, at least three kinds of microcapsules corresponding to magenta, yellow and cyan colors, respectively, are uniformly distributed on the recording sheet 37. The lens system 9 is mounted on a lens mount plate 10 with a possibility of fine angle adjustment with respect to the optical path thereof.

The light beams passed through the filter 8 and converged by the lens system 9 are turned at an angle of 180 degrees by means of a pair of oppositely arranged reflection mirrors 11, 11 and form a latent image on the recording sheet 37 which is in close contact with the down side of an exposure tray 19. The two reflection mirrors 11, 11 are fixedly mounted on a mirror mount plate 12 so that adjustment of the optical path and focusing takes place by fine adjustment of the position of the mirror mount plate 12.

The recording sheet 37 in the continuous form is wrapped around a cartridge shaft 14 which is housed in a detachable cartridge 13 located under the glass tray 2. One end of the sheet 37 reaches a take-up shaft 25 by way of multiple rollers and a pressure developing device 200.

The recording sheet 37 coming from the underside of the cartridge 13 is guided along the underface of the exposure tray 19 by means of feed rollers 15, and guide rollers 17, 18 and fed to the pressure developing device 200. The sheet 37 passed through the pressure developing device 20 is then sent to a separation roller 23 and a winding run adjustment roller 24, and is taken up onto the take-up shaft 25. The unexposed sheet 37 leaving the cartridge 13 is protected against light by means of a shield cover 16.

The recording sheet 37 is controlled by paper feed rollers 22, 22 to travel at a constant feed rate in synchronism with the speed of the reciprocal movement of the glass tray 2. Thus, the latent image of a certain line on the original subject is built one by one on the sheet 37 while it is passed along the exposure tray 19.

Below the pressure developing device 200, located is a developer sheet cassette 32 accommodating cut-sheet type developer sheets 38. The developer sheet 38 is picked out by one by means of a semi-cylindrical roller 33 and is transferred by means of a pair of developer sheet rollers 34, 34 through a swingable gate 35 to be brought into the pressure developing device 200, in such a fashion that the recording sheet 37 and the developer sheet 38 are sent together to the pressure developing device 200 in a superposed state. The pressure developing device 200 consists of a pair of pressure rollers 21 and 31. Further, a sensor 300 provided with the developer sheet cassette 32 detects the size of developer sheet 38 to be pressurized, and pressure force between the pair of rollers 21 and 31 are controlled by the detected size data. The superposed sheets 37 and 38 ar thus pinched and pressed between the pressure rollers 21 and 31, with the inside surface of the recording sheet 37, on which the latent image is formed, contacting with the inside surface of the developer sheet 38 which is coated with a developing material. With this pressurizing, the microcapsules remaining unexposed are crushed to develop a visible image on the developer sheet 38.

The recording sheet 37 and the developer sheet 38 leaving the pressure developing device 200 are then travelled by means of the rollers 22, 22. The recording sheet 37 and the developer sheet 38 are then separated from each other by the separation roller 23, the former going in upward direction and the latter going in leftward direction, as shown in FIG. 1. The developed image on the developer sheet 38 is fixed by means of a thermal setting unit 20. The developer sheet 38 is then discharged to a sheet outlet tray 27 with the image-carrying side facing up. The heat setting unit 20 consists of a pair of a roller 29a and a hollow heat roller 29b accommodating a heater 30 therein and a pair of feed roller 28, 28.

The recording sheet 38 separated is taken up around the take-up shaft 25 by way of the winding run adjusting roller 24.

Figure 2:
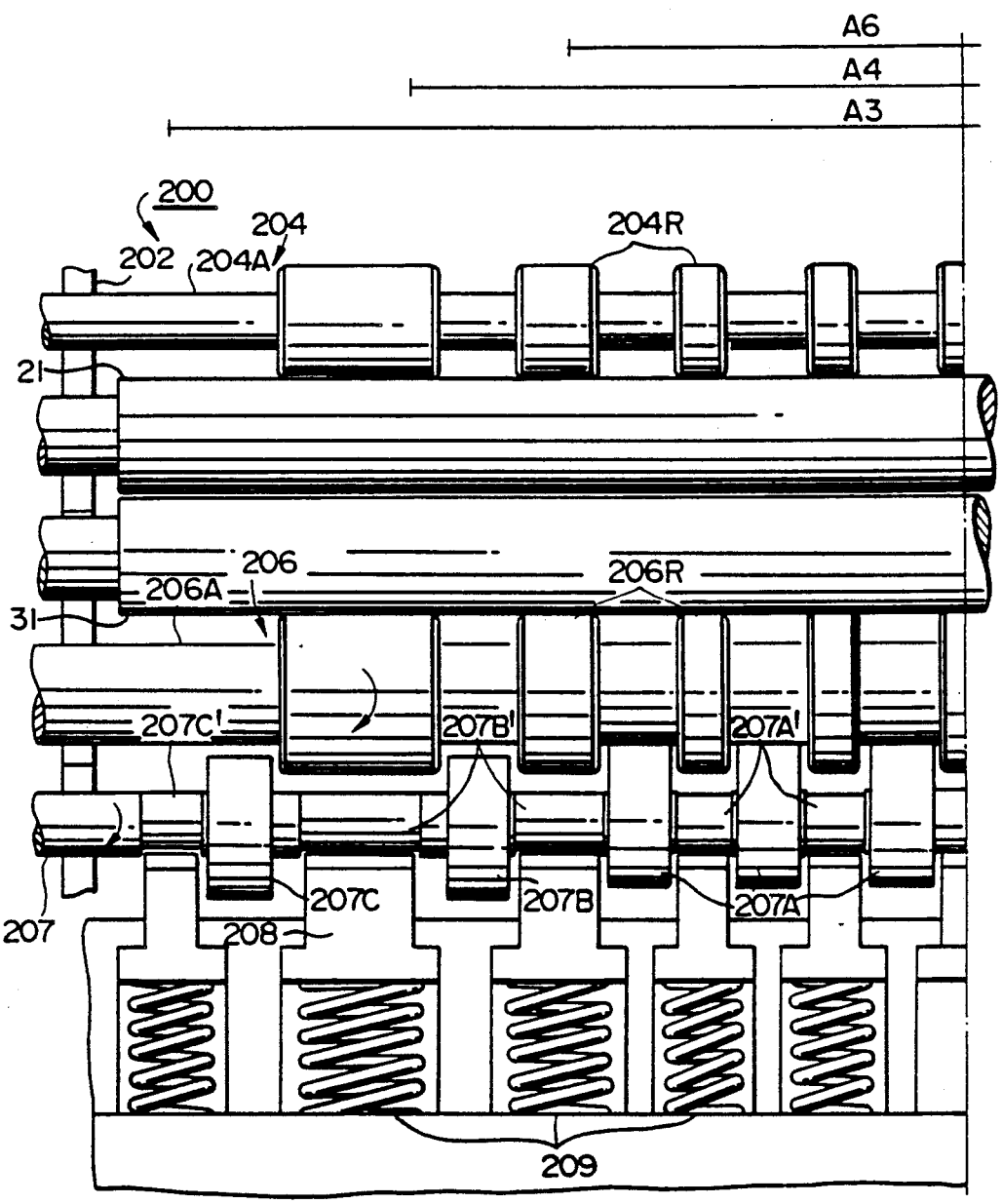

FIG. 2 is a detailed sectional view illustrating the pressure developing device 20 according to the invention. As shown, a set of backup rollers 204 are placed in parallel to a pressure roller 21 pivotally carried on the frame 202 in contact with the pressure roller 21 to avoid flexing thereof. Under a lower pressure roller 31 likewise carried on the frame 202 placed are a set of lower backup rollers 206 which ar in contact with the lower pressure roller 31 for the same reason as above. The lower pressure roller 31 is at its both ends carried on the frame 202 so that it is slightly movable up and down. The lower pressure roller 31 is adapted to be rotatably driven by a well-known driving unit (not shown).

The upper and lower backup roller set 204 and 206 each consists of a plurality of small subrollers 204R and 206R spaced from each other and rotatably mounted on a common shaft 204A and 206A by means of a bearing or similar element. The shaft 204A of the upper backup roller set 204 is fixedly mounted at its both ends on the frame 202 to keep the roller set 204 from rotation. The shaft 206A of the lower backup roller set 206 is also fixed to the frame 202 to keep it from rotation, but is carried at its both ends so that its slight up and down movement is allowed together with the lower pressure roller 31. Under the lower backup roller set 206, a camshaft 207 is rotatably carried by the frame 202 so as to selectively apply a pressure force to the lower pressure roller 31 through the lower backup roller set 206. The camshaft 207 is in drive connection with a well-known driving unit (not shown) and is adapted to be brought to a stop in a certain angular position by means of a step clutch. The angular position of the camshaft 207 is controlled in accordance with the data detected by paper size detecting means 300.

Figure 3:
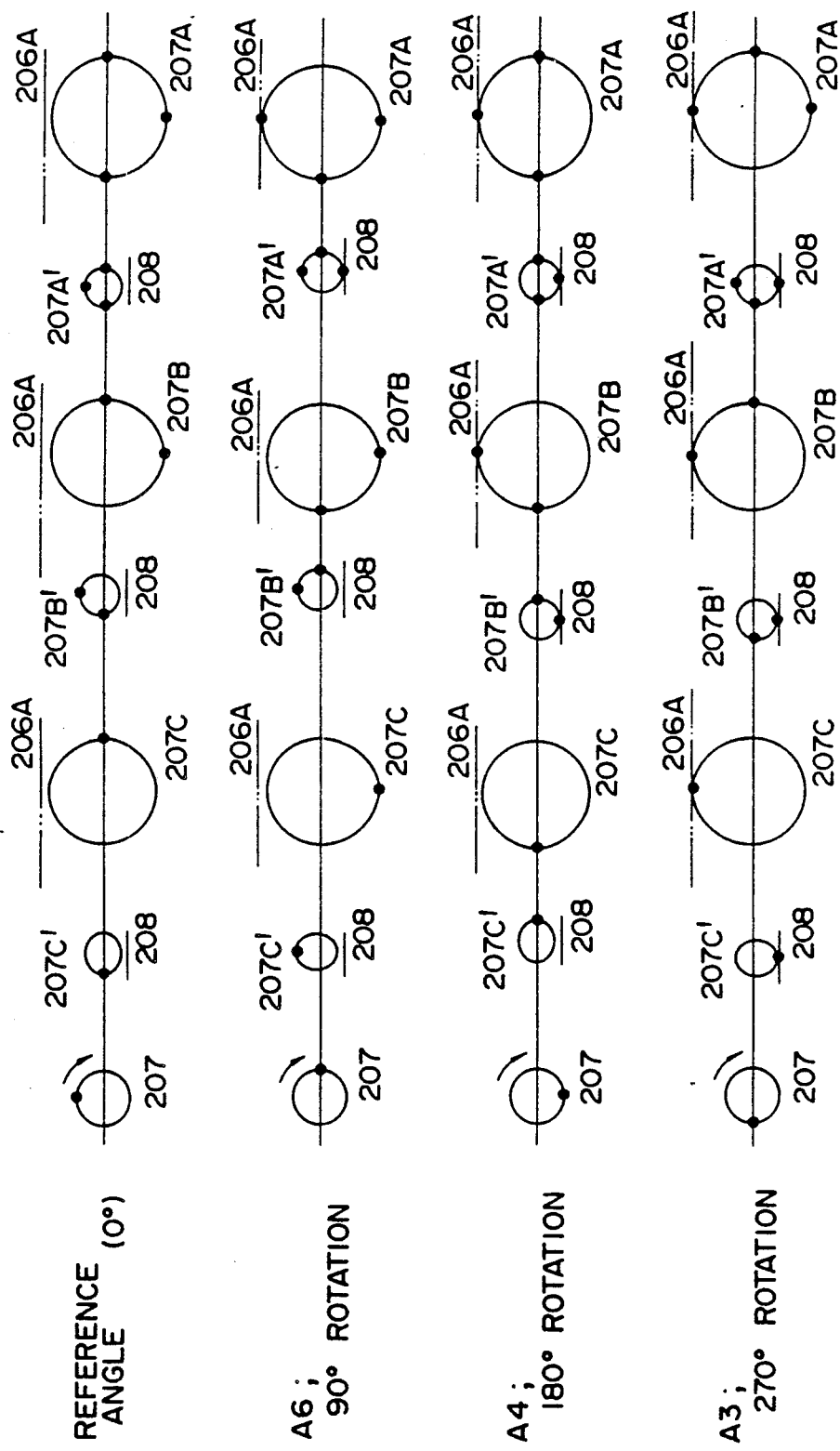

As shown in FIG. 3, the angular positions of the camshaft 207 with respect to the reference angle (0**) are set in this embodiment at 90° for A6(postcard) size, 180° for A4 size and 270° for A3 size.

Cams 207A, 207B and 207C provided on the camshaft 207 are designed in sharp so that they are brought into and out of contact with the shaft 206A of the lower backup roller set 206 in dependence on the angular position of the camshaft 207. Also, cam stems 207A°, 207B° and 207C° extending between cams 207A, 207B and 207C are designed in shape so that they are brought into and out of contact with the top faces of a pressure block 208 provided under the camshaft 207 in dependence on the angular position of the camshaft 207.

When, for instance, a data for the A6 size is received from the detecting means 300 for detecting the width of the developer sheet 38, as soon as the leading end of a postcard-size sheet of developer sheet begins to be placed between the pressure rollers 21 and 31, the camshaft 207 is rotated through about 90° so that the cam 207A is located almost right under the sheet of this size is brought into pressure contact with the lower backup roller set 206. As a result, a resilient load of a compression coil spring 209 is transmitted to the lower pressure roller 31 by way of the pressure block 208 so that a sufficient pressure force is developed between the pressure rollers 21 and 31 over their longitudinal length corresponding to the postcard width. At this time, the cams 207B and 207C which are not in use for pressure application at present are kept out of contact with the lower backup roller set 206. In this arrangement, thus, the pressure force is developed over a certain section (approx. 150 mm) around the middle point of the pressure rollers 21 and 31 excluding the both ends thereof. Pressure distribution across this section should be preset by selecting the radius and width of the plural subrollers 204R and 206R as well as the spring constant of the pressure spring 209. As a result, the pressure force applied to the both ends of the developer sheet 38 is made somewhat lower to prevent wrinkles. Likewise, when pressure-developing an A4 size sheet of paper (with 20 its width extending over the roller of 210 mm), the camshaft 207 is rotated through about 180° so that the cams 207A and 207B are brought into pressure contact with the shaft 206A of the lower backup roller set 206. As shown in FIG. 2, these cams 207A and 207B are so located that the pressure is developed sufficiently over the width of the A4 size of developer sheet 38.

If the camshaft 207 is in a 0° angular position with respect to the reference angle, all the cams 207A 207B and 207C are out of contact with the lower backup roller set 206 as shown in FIG. 3. The lower backup roller set 206 and the lower pressure rollers 31 in this position move slightly down to produce a clearance with the upper pressure roller 21.

Figure 4:
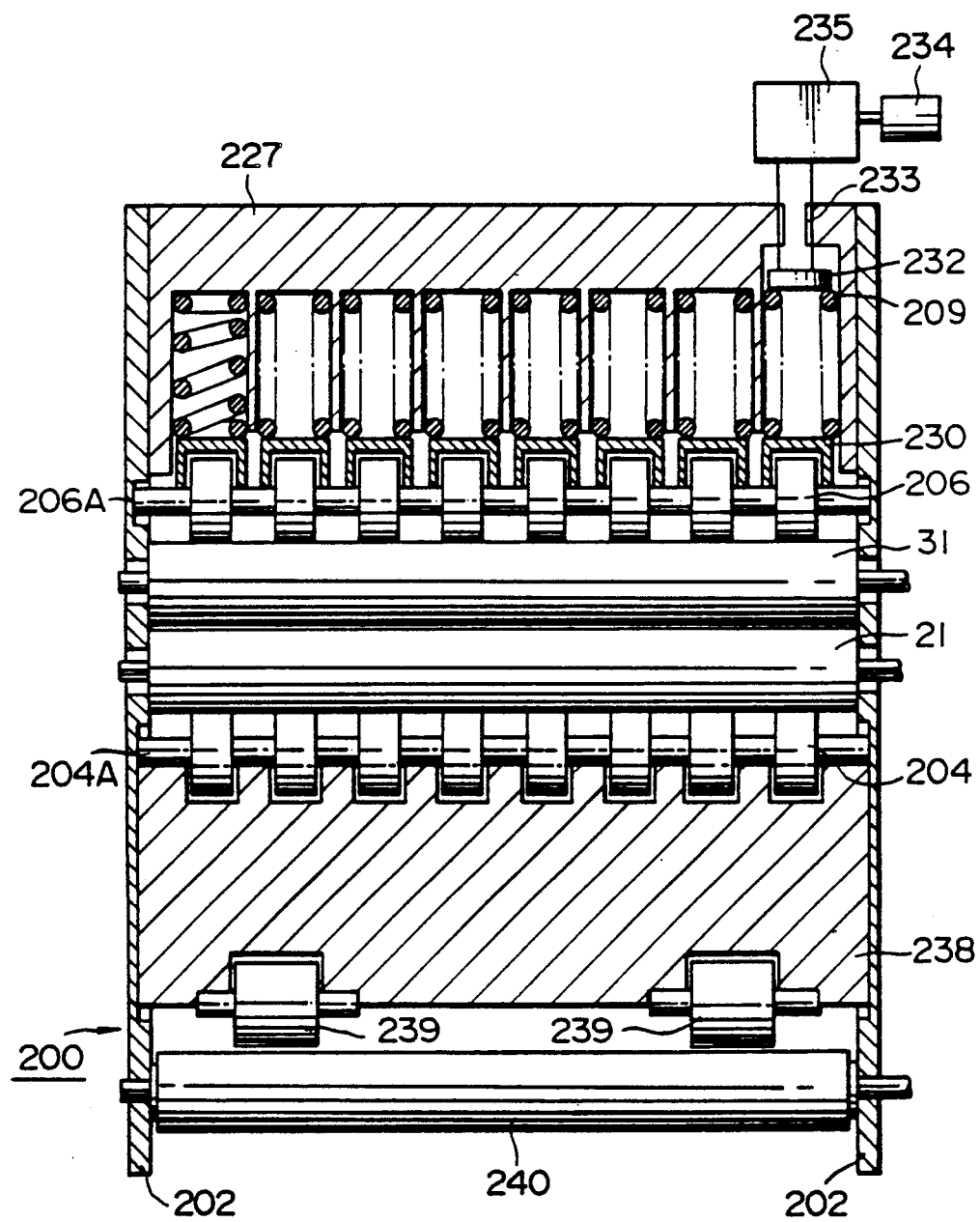

FIG. 4 is an another embodiment of the present invention. The pair of pressure rollers 21 and 31 provided on the frame 202 like the above embodiment. The frame 202 in turn is mounted on an upper support 227. There are a plurality of suitably spaced backup rollers 206 (8 in the embodiment shown) coaxially mounted on a shaft 206A, which are in contact with the top face of the upper pressure roller 31 to apply pressure force thereto. The roller shaft 206A carrying theses rollers 206 is guided by the frame 202 for vertical displacement which is restricted by backup retainers 230. The backup retainers 230 are biased downward by springs 209 fitted in the hollow at the support 227.

One of the springs 209 at a lateral end (right end in the drawing) is at its top end received by a spring retainer 232 which in turn is supported by a load screw 233. The load screw 233 is driven by a gear head 235 in drive connection with a motor 234 to thereby adjust pressure force to be applied to the springs 209.

On the other hand, another set of backup rollers 204 are in contact with the underface of the lower pressure roller 21. The roller shaft 204A of these rollers 204 is carried by a support 238 which in turn is guided by the frame 202 for vertical movement. The bottom of the support 238 is in contact with a switching cam 240 carried by the frame 202 by way of switching rollers 239. The support 238 is thus vertically movable by rotating the cam 240.

Reference is now made to FIG. 5 for description of an another embodiment. The arrangement of the part below the backup retainer 230 is the same as those in the above embodiment. Passed through 8 through holes at the support 227A are springs 209, over which spring retainers 232A are in contact with three kinds of loading cams 241A, 241B and 241C fitted on a load cam shaft 241 by way of loading rollers 232B. The vertical section of these loading cams 241A, 241B and 241C are shown in FIG. 6.

In this embodiment, compression of the spring 209 is varied by rotating the loading cam shaft 241 in dependence on the selected size of developer sheet 38, whereby pressure distribution is made uniform across the developer sheet 38.

Figure 7:
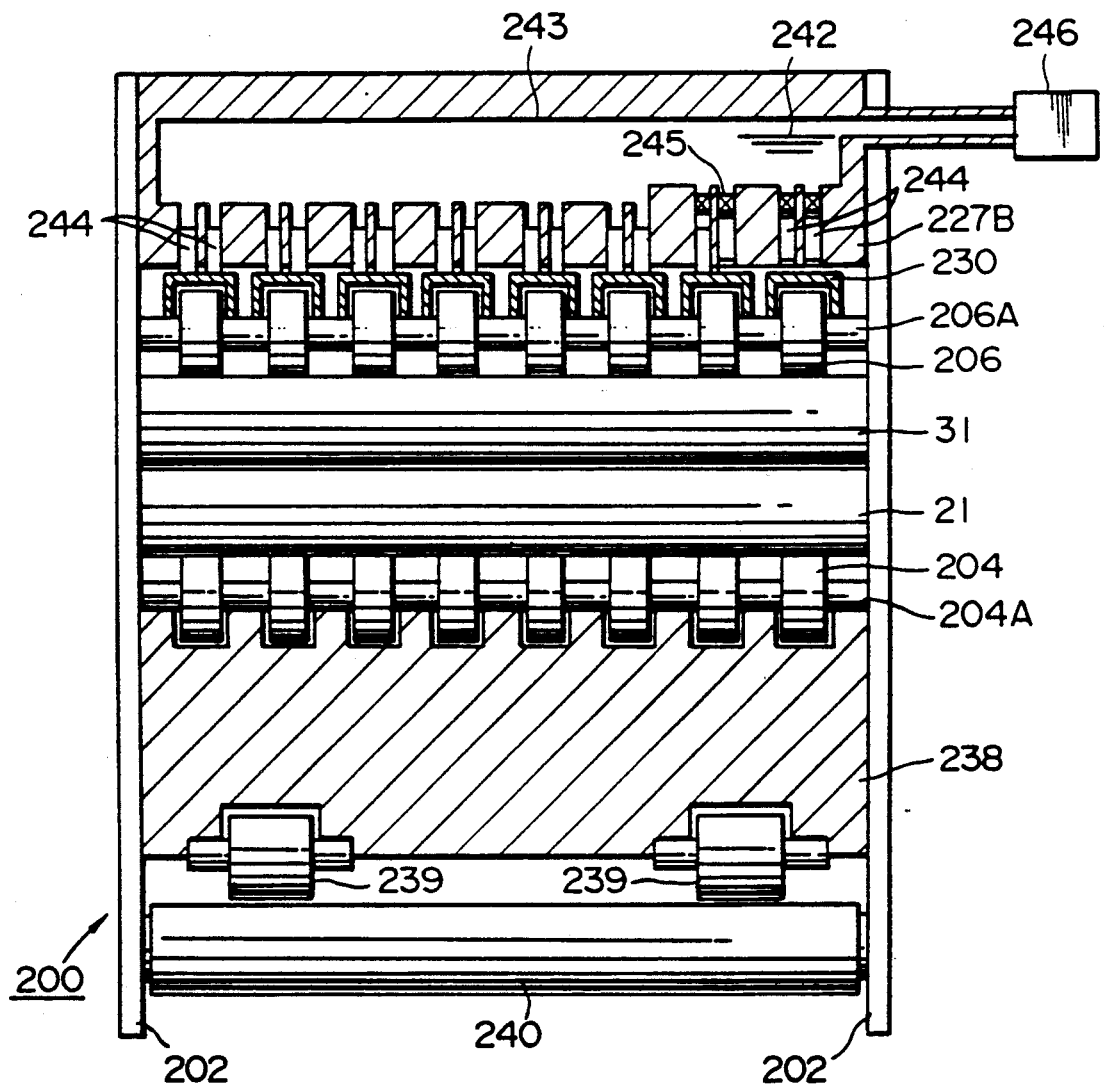

A further another embodiment of the invention is now described with reference to FIG. 7. The part below the backup retainer 230 is the same as in the preceding embodiments. The support 227B includes an oil chamber 243 filled with oil 242. Each backup retainer 230 has two piston 244, 244 loaded by oil 242 toward the retainer 230. The right-hand four pistons 244 are provided with valves 245. Oil chamber 243 is associated with an oil pump 246. The pistons 244, 244 are pulled upward by means of the oil pump 246 before the developer sheet 38 reaches the pair of pressure rollers 21 and 31. When the paper begins to pass between the rollers, the valves 245 are appropriately closed in accordance with the detected paper width to operate the oil pump 246. The number of pistons to push the retainer is selected accordingly to adjust the pressure force.

If the image formed on the recording sheet 37 is reduced size image with respect to an original, it may be considered that the pair of pressure rollers 21 and 31 pressurized an area of the recording sheet 37 and the developer sheet 38 corresponding to the area exposed by the light emitted from the halogen lamp 3, and the unexposed area is exposed by the light emitted from the other light source, for example, an LED (Light-Emitting-Diode) array 400 provided below the exposure tray 19.

Figure 8:
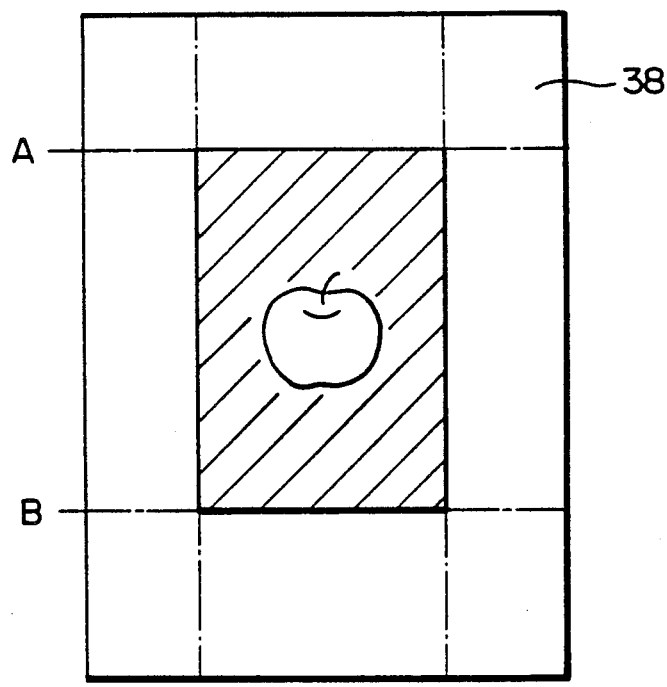
Figure 9:
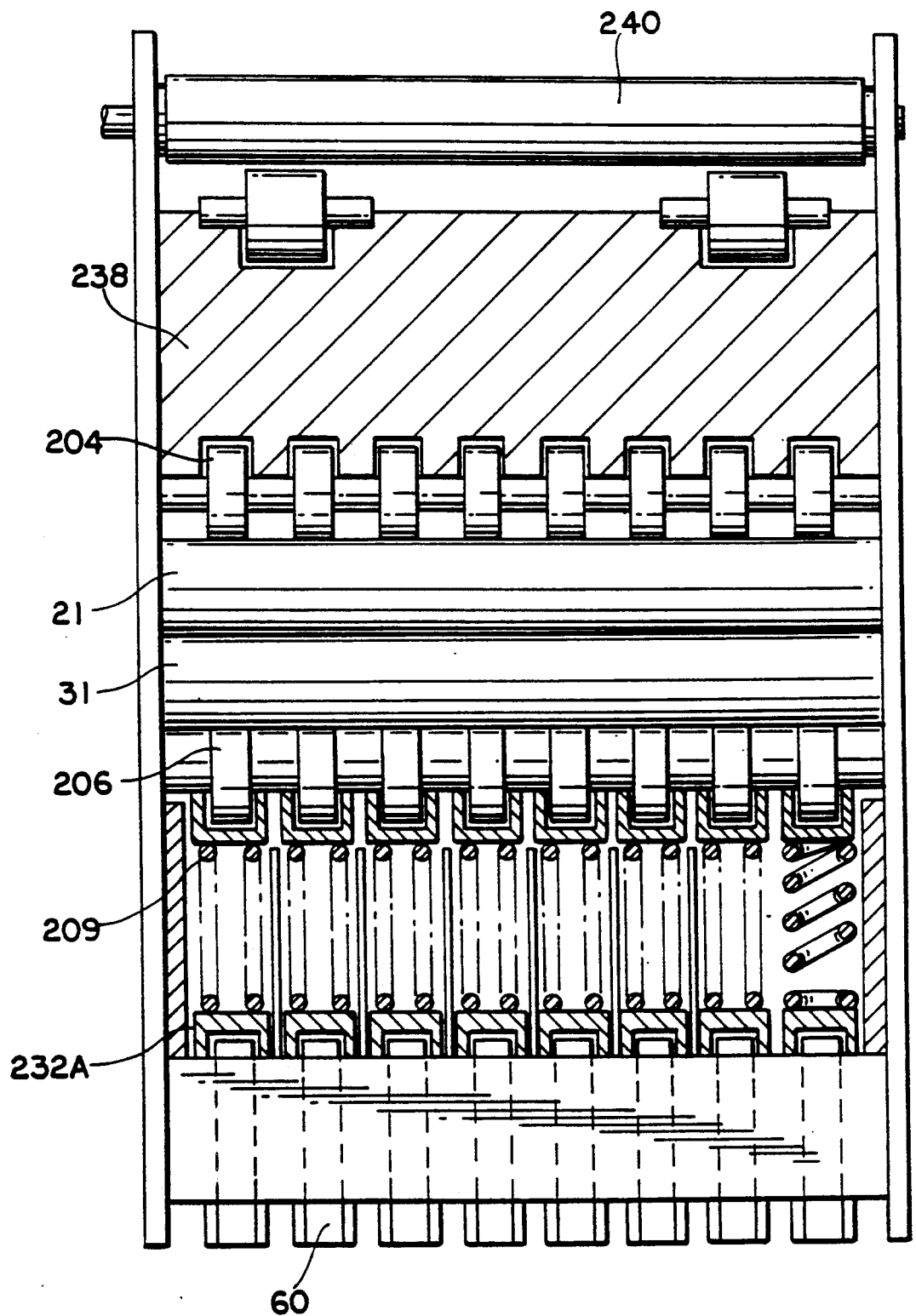
FIG. 9 is a sectional view showing another embodiment of the invention.

In this case, if the reduced scale is a half size for instance, as shown in FIG. 8, the pair of pressure rollers 21 and 31 only pressurize the area between A and B, and the LED array 400 exposes the area corresponding to a quarter of the area on either sides.

It may be further considered that the area corresponding to a quarter of the area on either sides are not pressurized by the rollers 21 and 31 by means of an adjustment of the pressure force applied to the backup rollers 206.

With the employment of the back-up rollers 206, it is possible to avoid an undesired unevenness of pressure force in a width direction of the sheets to be pressurized. That is, conventionally, only a pair of rollers such as 21 and 31 shown in FIG. 2, 4, 5, 7, and 9 of this application are employed. In such conventional devices, when the overlapped sheets 37, 38 (sheet 37 being a microcapsule sheet coated with a plurality of microcapsules each containing at least a dye material and a component to change the rupture strength thereof when exposed to light, and sheet 38 being a developing sheet coated with a developing material which is reactable with the dye material having been contained in the microcapsules and being streamed out from the microcapsules when crushed,) are nipped between the pair of rollers 21, 31, however, a pressure force applied onto surfaces, i.e., contacting surface of the two types of the sheets varies depending on the bending condition of the pair of rollers. In general, each of the pair of rollers are respectively bent in such a manner that a gap between the pressure rollers at the central portion along a width direction becomes larger than that at the both side edge portions. Thus, a developing condition along the width direction of the recording medium depends on a distribution of the pressure force, resulting in uneven colors and uneven densities along the width direction. In addition, when the pressure force being applied remarkably varies, as described above, along the width direction, the sheets may be wrinkled.

Figure 10:
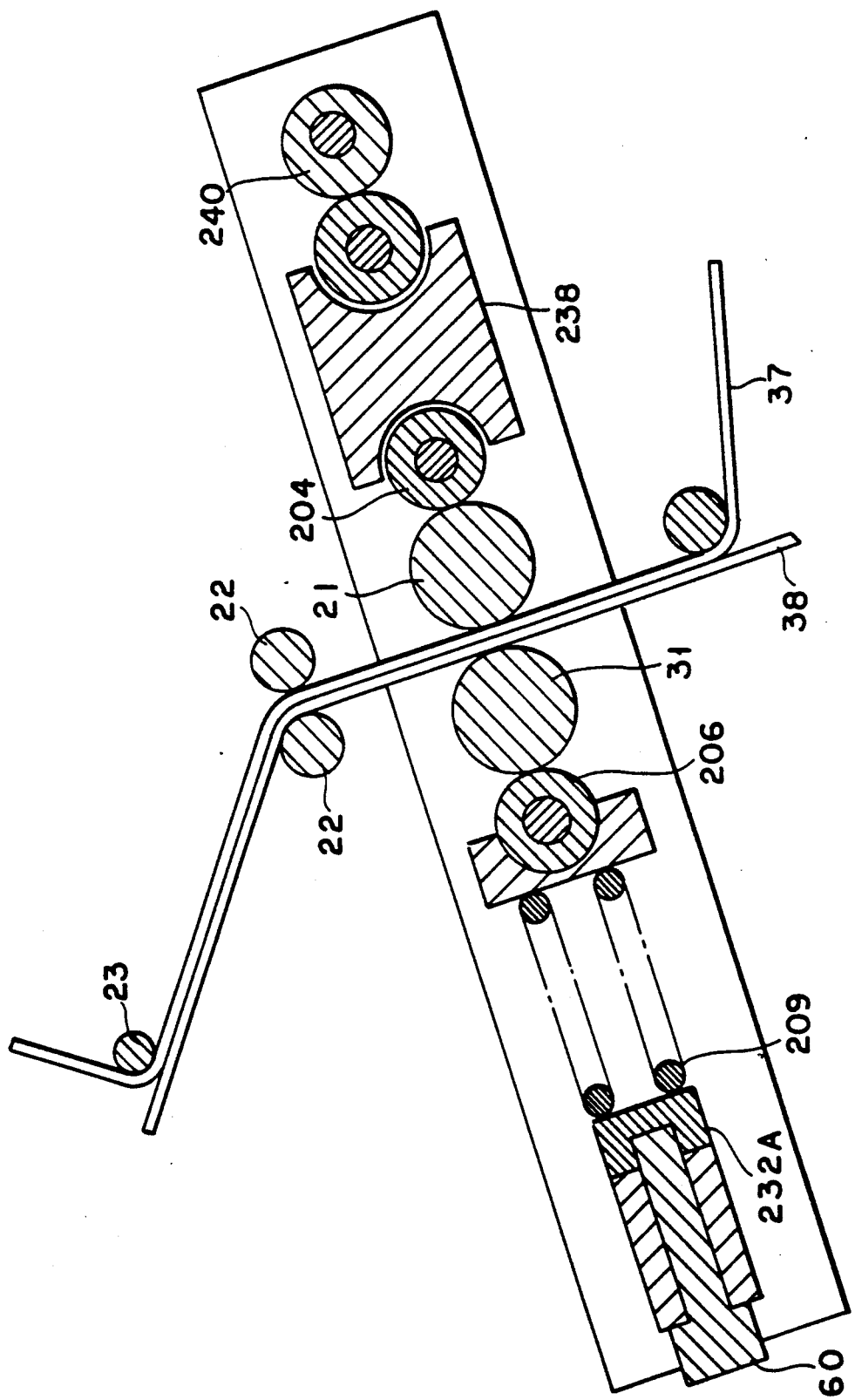
FIG. 10 is a sectional view of the embodiment of FIG. 9.

In accordance with the present invention, a plurality of back-up rollers 206, adapted to be brought into and out of contact with one of the pair of rollers, are provided. Each of the back-up rollers 206 are respectively arranged to be biased by elastic springs 209 toward the one of the pair of rollers 31, and push force of the elastic springs 209 for pushing each of the back-up rollers are arranged to be adjustable by a predetermined member, for example, by loading cams 241A through 241C illustrated in FIG. 5. As another embodiment shown in FIGS. 9 and 10, it may be considered that each length of the elastic springs 209 are arranged to be adjustable by screw 60 for adjusting the length of the elastic springs 209.

In particular, it is effective to provide the above back-up rollers so as to pressurize the one of the pair of rollers which is to be contacted with the developing sheet 38, because a thickness of the developing sheet 39 (for example, a pulp sheet whose thickness is approx. 110 $\mu$m) is thicker than that of the microcapsule sheet 37 (for example, polyethleneterephthalate sheet whose thickness is approx. 40 $\mu$m) and a rigidity of the former is smaller than that of the latter. In other words, the developing sheet 38 can effectively absorb the pressure force than the microcapsule sheet 37 absorbs it, and it is easier to adjust a pressure force to be applied to the pressure rollers through the developing sheet 38 as compared with the case in which the pressure force is adjusted through the microcapsule sheet 37.

As is readily understood from the above description, the pressure developing device according to the invention provides a constantly excellent picture quality regardless of paper sizes of the sensitized paper, while preventing development of wrinkles of the sensitized paper.

The present invention is not limited to the preceding embodiments and allows various modifications. For instance, while the embodiments employ a pressure-sensitized recording medium consisting of a microcapsule sheet and a developer sheet, it is possible to use a self-developing type recording medium.

What is claimed is:

1. In combination a pressure developing device for developing an image by pressurizing a recording sheet and a developing sheet together in an overlapped state, a recording sheet and a developing sheet; said recording sheet being coated with a plurality of microcapsules each containing therein a dye precursor and a component to change the rupture strength thereof when exposed to light, and said developing sheet being coated with a developer material which is reactable with said dye precursor, said developing sheet having a thickness greater than that of said recording sheet, said pressure developing device comprising:

a pair of pressure-developing roller members, adapted to be brought into and out of contact with each other; and a plurality of back-up roller members adapted to be brought into contact with one of said pressure developing roller members which is contacted with said developing sheet, each of said back-up roller members respectively being arranged to push said one of said pressure developing roller members with an adjustable force so as to generate a pressure force between said pair of pressure-developing roller members only in a direction from said developing sheet toward said recording sheet.

2. The pressure developing device according to claim 1 which further comprises another back-up roller members adapted to be brought into contact with the other of said pair of pressure-developing roller members.

3. The pressure developing device according to claim 1, wherein each of said back-up roller members is biased toward said one of said pair of pressure developing roller members by a plurality of elastic spring members, each of said elastic spring members generating an adjustable push force.

4. The pressure developing device according to claim 3, wherein said push force generated by each of said elastic spring members are adjusted by screw members respectively arranged to adjust length of each of said elastic spring members.

5. The pressure developing device according to claim 3 wherein said elastic spring members are evenly distributed along a width direction of said overlapped sheets.

6. The pressure developing device according to claim 5 wherein each of said elastic spring members respectively pushes each of said back-up roller members.

7. In combination an imaging device and a recording medium
said recording medium comprising a recording sheet on which a latent image is formed and a developing sheet on which a visible image corresponding to the latent image is formed, said recording sheet comprises a continuous form recording sheet coated with a plurality of microcapsules each containing therein a dye precursor and a component to change the rupture strength thereof when exposed to light, said developing sheet comprises a cut-form developing sheet coated with a developer material which is reactable with said dye precursor, said developing sheet being thicker than said recording sheet;
said imaging device comprising:
pressuring means for pressurizing said recording sheet on which the latent image has been formed and said developing sheet together in an overlapped state, said pressurizing means comprises a pair of pressure roller members adapted to be brought into and out of contact with each other and to generate a force only in a direction from said developing sheet toward said recording sheet; and
uniformalizing means for making said pressure force applied by said pressurizing means uniform in a width direction of the overlapped sheets.

8. The imaging device according to claim 7, wherein said uniformalizing means comprises a plurality of back-up roller members arranged to be brought into contact with one of said pair of pressure roller members which is contacted with said developing sheet, each of said back-up roller members respectively being arranged to push said one of said pressure developing roller members with an adjustable force.

9. The imaging device according to claim 8 which further comprises another back-up roller members adapted to be brought into contact with the other of said pair of pressure roller members.

10. The imaging device according to claim 8, wherein each of said roller members is biased toward said one of said pair of pressure roller members by elastic spring members, each of push force generated by said each of said elastic members respectively adjustable.

11. The imaging device according to claim 10, wherein said push force generated by each of said elastic spring members are adjusted by screw members respectively arranged to adjust length of each of said elastic spring members.

* * * * *